(12) United States Patent
Takeda et al.

(10) Patent No.: US 10,503,002 B2
(45) Date of Patent: Dec. 10, 2019

(54) DISPLAY DEVICE

(71) Applicant: Japan Display Inc., Minato-ku (JP)

(72) Inventors: Arihiro Takeda, Tokyo (JP); Shoji Hinata, Tokyo (JP); Yoshikatsu Imazeki, Tokyo (JP); Nobuko Fukuoka, Tokyo (JP); Jin Hirosawa, Tokyo (JP)

(73) Assignee: Japan Display Inc., Minato-ku (JP)

( * ) Notice: Subject to any disclaimer, the term of this patent is extended or adjusted under 35 U.S.C. 154(b) by 64 days.

(21) Appl. No.: 15/922,285

(22) Filed: Mar. 15, 2018

(65) Prior Publication Data

US 2018/0267353 A1    Sep. 20, 2018

(30) Foreign Application Priority Data

Mar. 17, 2017  (JP) ................. 2017-053014

(51) Int. Cl.
| | |
|---|---|
| *G02F 1/1335* | (2006.01) |
| *G02F 1/1339* | (2006.01) |
| *G02F 1/1343* | (2006.01) |
| *G02F 1/1362* | (2006.01) |
| *G06F 3/041* | (2006.01) |
| *G06F 3/044* | (2006.01) |
| *H01L 27/12* | (2006.01) |

(52) U.S. Cl.
CPC ...... *G02F 1/133514* (2013.01); *G02F 1/1339* (2013.01); *G02F 1/1343* (2013.01); *G02F 1/133512* (2013.01); *G02F 1/136286* (2013.01); *G06F 3/044* (2013.01); *G06F 3/0412* (2013.01); *H01L 27/124* (2013.01); *H01L 27/1218* (2013.01); *G02F 2201/121* (2013.01); *G02F 2201/123* (2013.01)

(58) Field of Classification Search
CPC combination set(s) only.
See application file for complete search history.

(56) References Cited

U.S. PATENT DOCUMENTS

| | | | |
|---|---|---|---|
| 2015/0009422 A1* | 1/2015 | Tung | G06F 3/044 349/12 |
| 2015/0170575 A1* | 6/2015 | Kwak | G06F 3/047 345/174 |
| 2015/0268797 A1* | 9/2015 | Kurasawa | G06F 3/0418 345/174 |
| 2019/0041441 A1* | 2/2019 | Higuchi | G01R 27/2605 |

FOREIGN PATENT DOCUMENTS

JP    2012-247542    12/2012

* cited by examiner

*Primary Examiner* — Deeprose Subedi
(74) *Attorney, Agent, or Firm* — Oblon, McClelland, Maier & Neustadt, L.L.P.

(57) ABSTRACT

According to one embodiment, a display device includes a first substrate including a first insulating substrate located in a first area and a second area, and a first conductive layer provided in the second area, a second substrate including a second insulating substrate located in the first area, and a second conductive layer, and a first connection line opposed to a first side surface of the second insulating substrate to electrically connect the first conductive layer and the second conductive layer. The first connection line is formed of a photosensitive resin containing a conductive material.

18 Claims, 14 Drawing Sheets

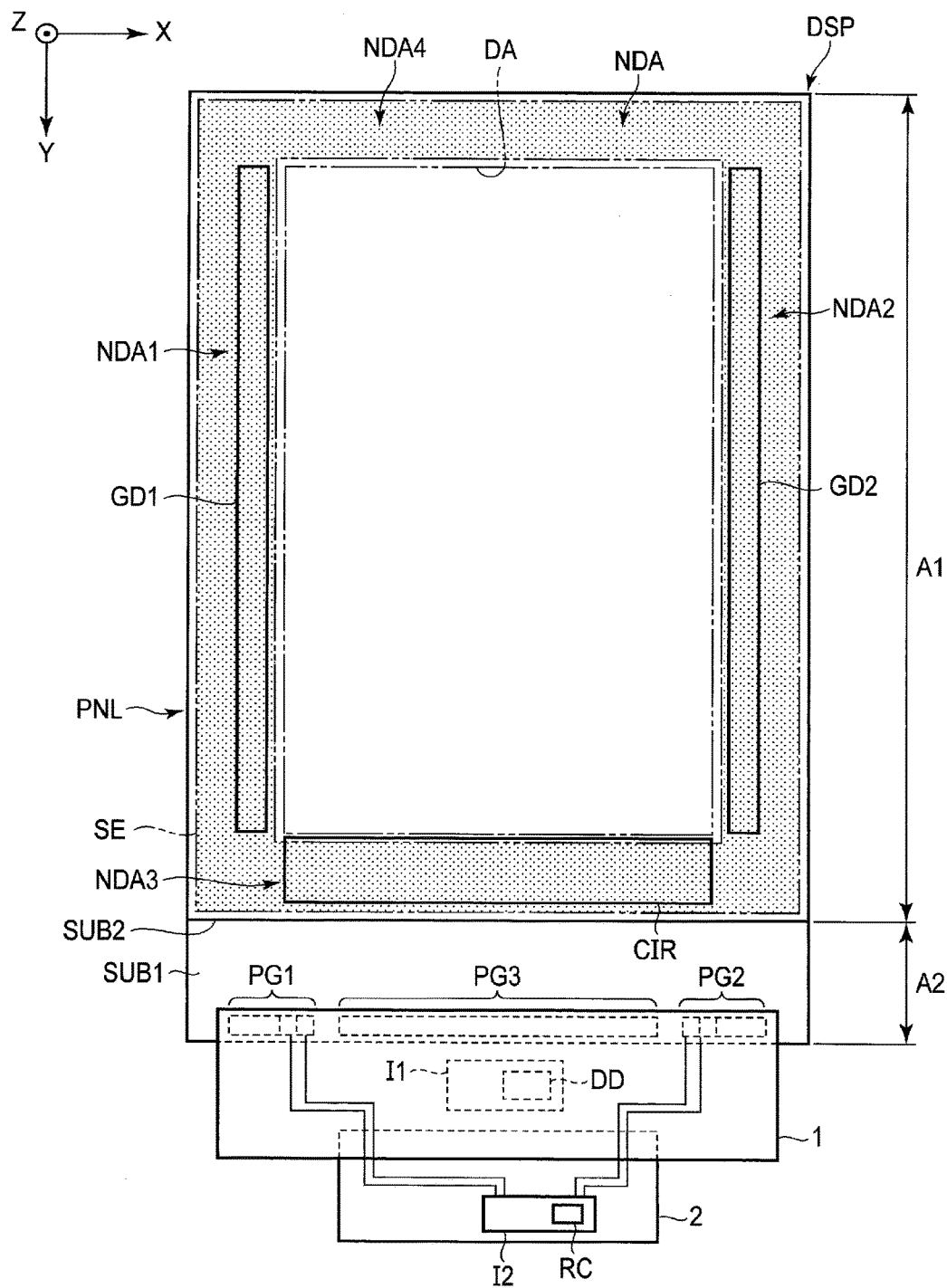
F I G. 1

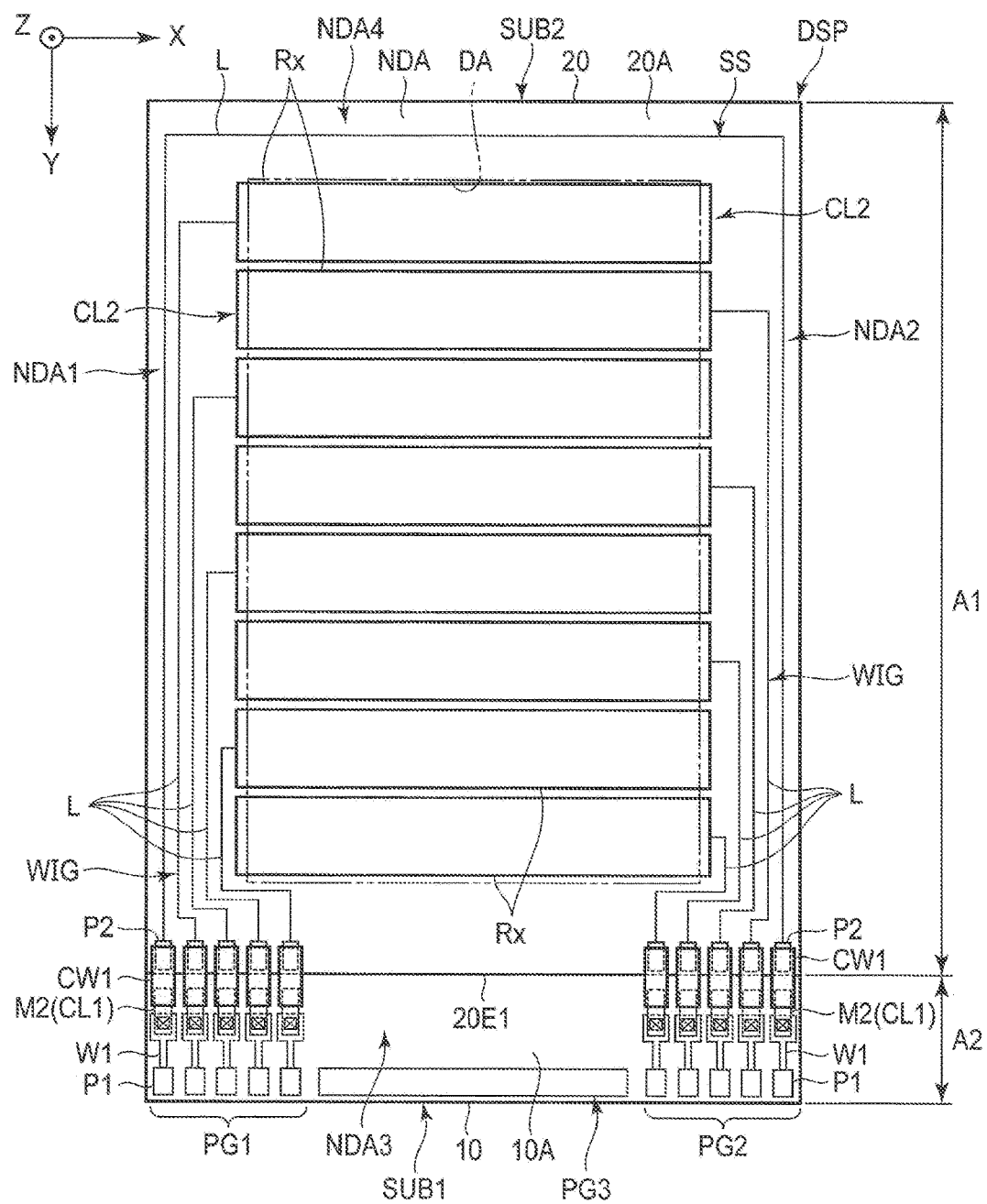
F I G. 2

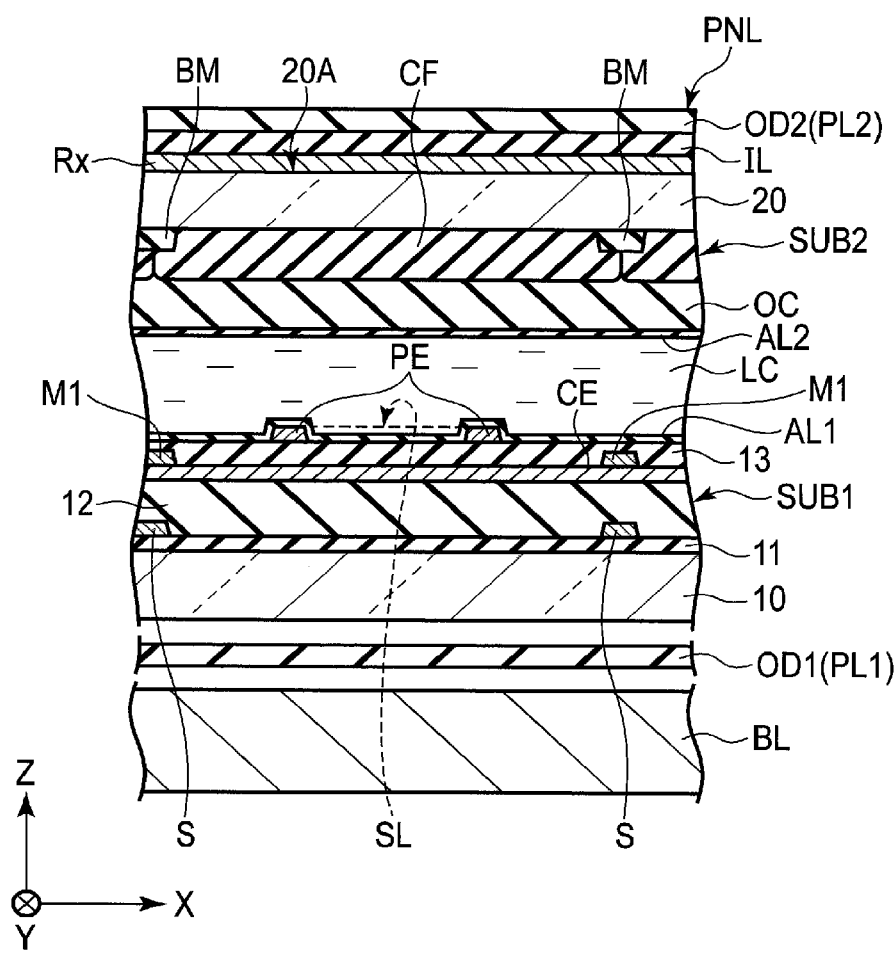
F I G. 4

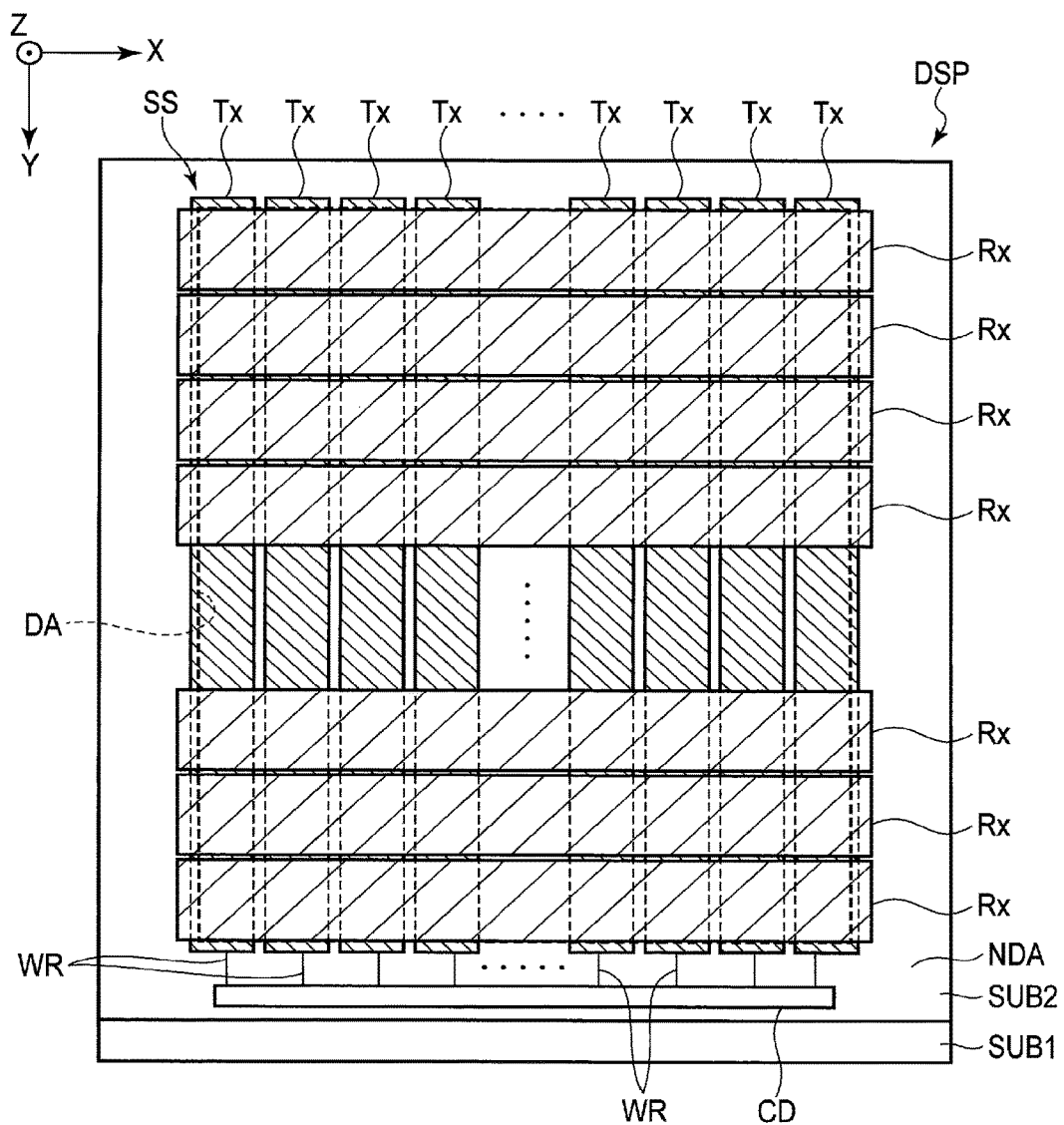
F I G. 5

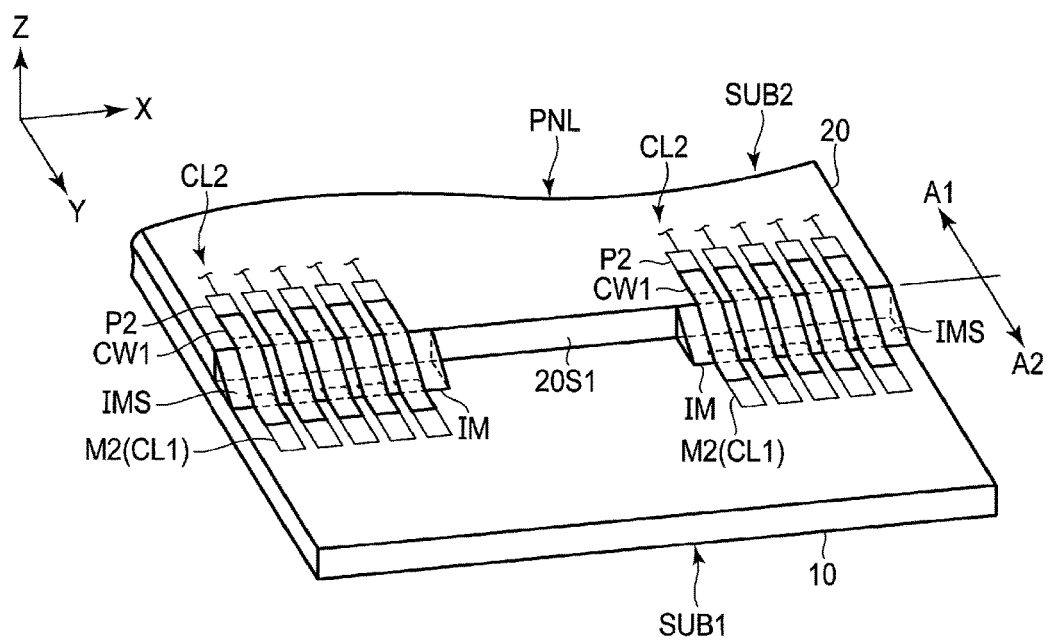
F I G. 6

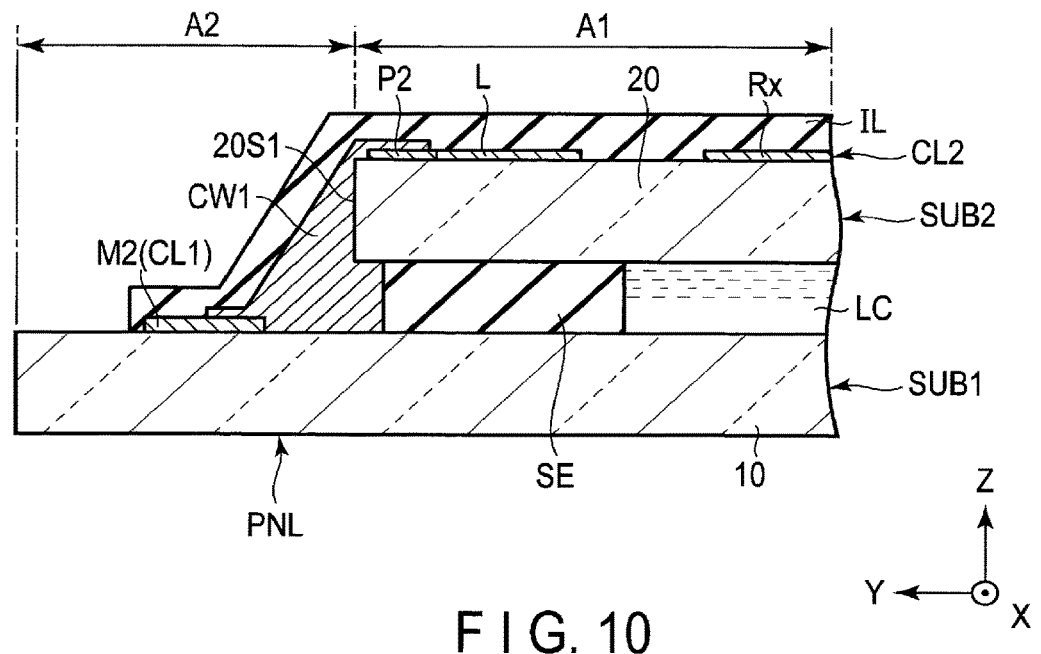
F I G. 10
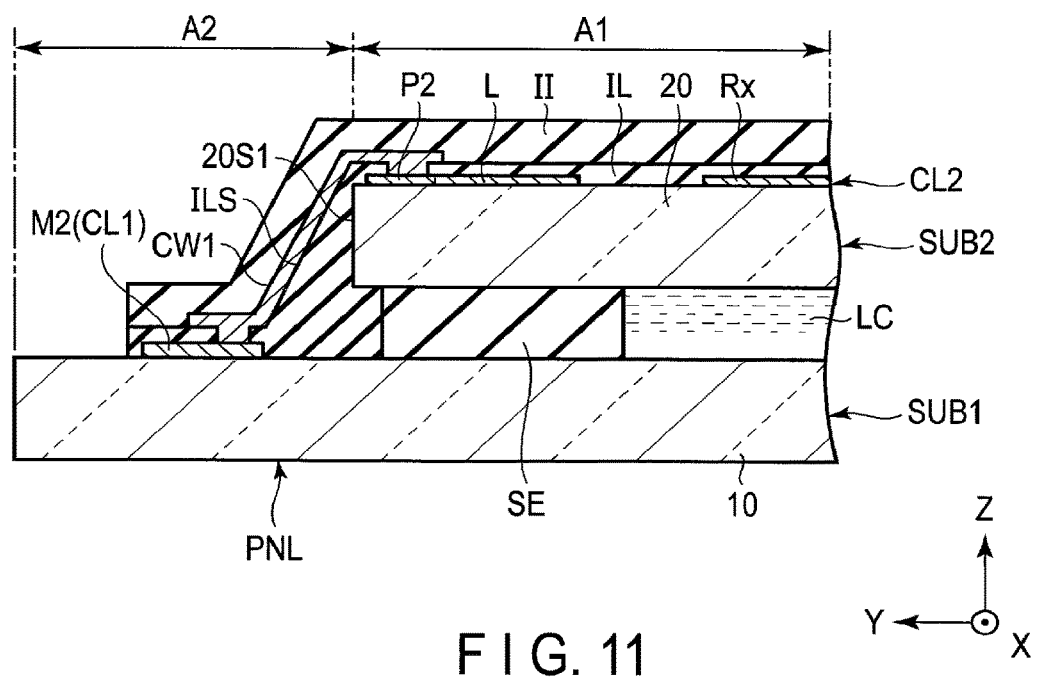
F I G. 11

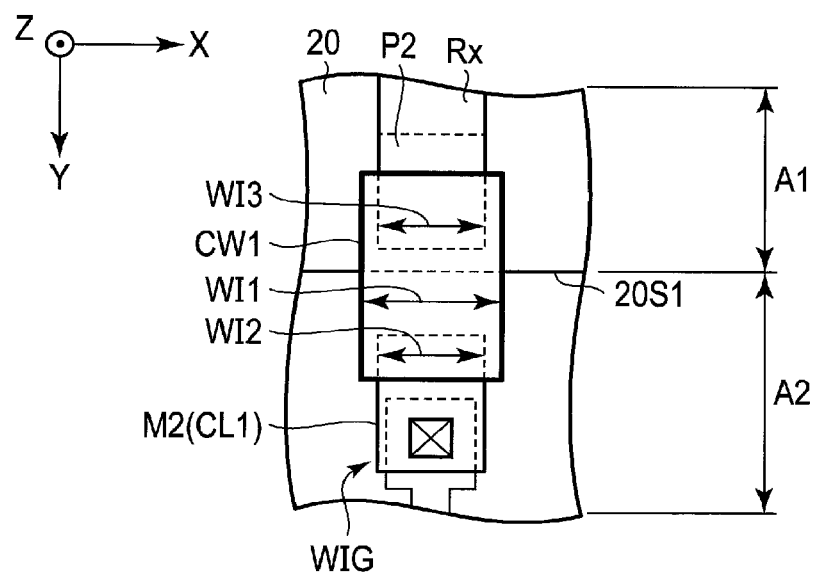
F I G. 15
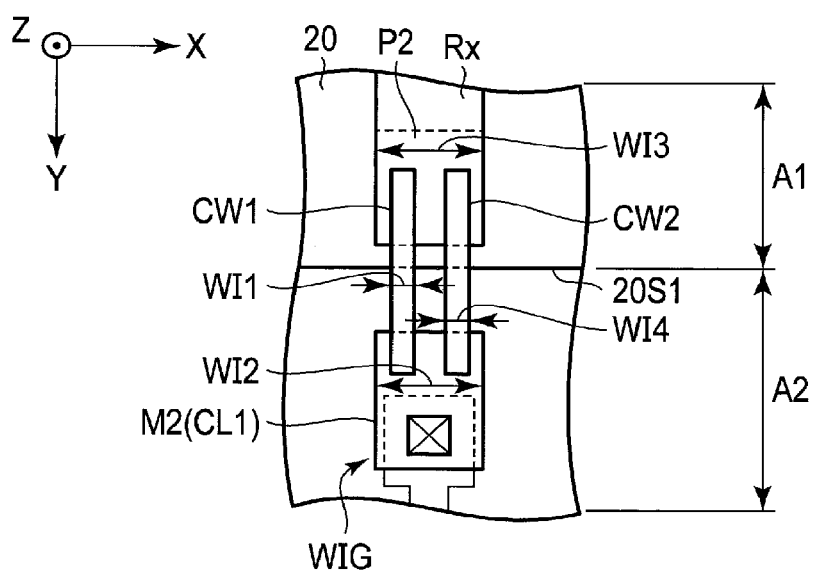
F I G. 16

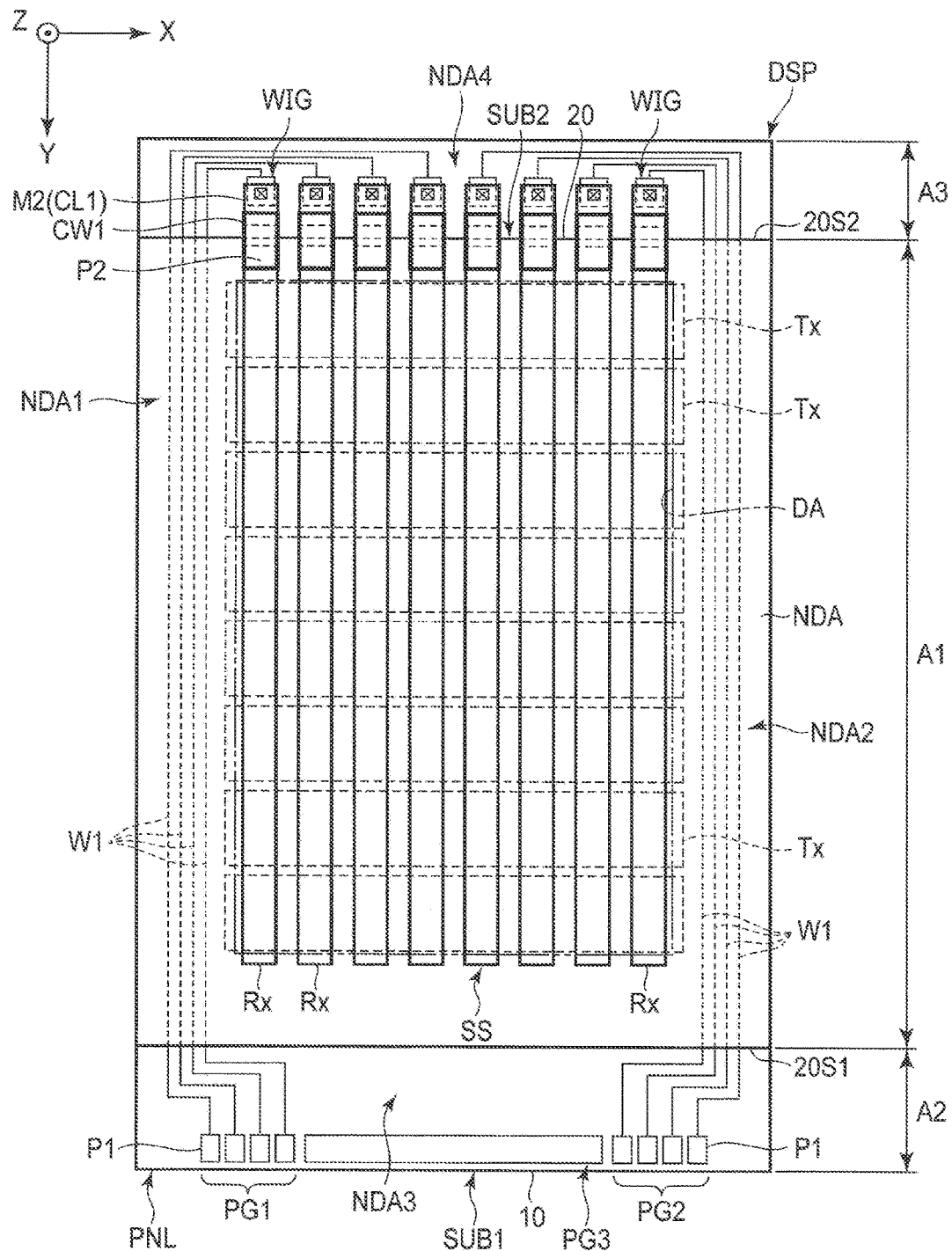
F I G. 17

DISPLAY DEVICE

CROSS-REFERENCE TO RELATED APPLICATIONS

This application is based upon and claims the benefit of priority from Japanese Patent Application No. 2017-053014, filed Mar. 17, 2017, the entire contents of which are incorporated herein by reference.

FIELD

Embodiments described herein relate generally to a display device.

BACKGROUND

A liquid crystal display device and the like are known as display devices. Liquid crystal display devices, having features such as lightness, slimness and low power consumption, have been used in various fields as office automation (OA) devices such as personal computers and display devices such as television sets. Recently, the liquid crystal display devices are also used as mobile terminal devices such as mobile telephones and display devices such as car navigation devices and game consoles. In recent years, a configuration of assigning a touch sensing function to a liquid crystal display panel which displays images is disclosed.

BRIEF DESCRIPTION OF THE DRAWINGS

FIG. 1 is a plan view showing a configuration example of a display device according to a First Embodiment.

FIG. 2 is a plan view showing a configuration example of a display panel of the display device, illustrating a plurality of detection electrodes, a plurality of pads, a plurality of line groups connecting the detection electrodes and the pads, and the like.

FIG. 4 is a cross-sectional view showing a structure of a part of the display device.

FIG. 5 is a plan view showing a configuration example of a sensor according to the First Embodiment.

FIG. 6 is a perspective view showing a part of the display panel, illustrating metal layers, an insulating member, second pads, first connection lines, and the like.

FIG. 7 is a cross-sectional view showing a part of the display device, illustrating a second area and the like.

FIG. 8 is a cross-sectional view showing a part of the display device according to Modified Example 1 of the First Embodiment, illustrating a second area and the like.

FIG. 9 is a cross-sectional view showing a part of the display device according to Modified Example 2 of the First Embodiment, illustrating the second area and the like.

FIG. 10 is a cross-sectional view showing a part of the display device according to Modified Example 3 of the First Embodiment, illustrating the second area and the like.

FIG. 11 is a cross-sectional view showing a part of the display device according to Modified Example 4 of the First Embodiment, illustrating the second area and the like.

FIG. 12 is a plan view showing a configuration example of a display panel of the display device according to a Second Embodiment, illustrating a plurality of detection electrodes, a plurality of pads, a plurality of line groups, and the like.

FIG. 14 is a plan view showing a part of the display device according to Modified Example 1 of the Second Embodiment, illustrating the second area and the like.

FIG. 15 is a plan view showing a part of the display device according to Modified Example 2 of the Second Embodiment, illustrating a first connection line and the like.

FIG. 16 is a plan view showing a part of the display device according to Modified Example 3 of the Second Embodiment, illustrating the first connection line, a second connection line, and the like.

FIG. 17 is a plan view showing a configuration example of the display panel of the display device according to Modified Example 4 of the Second Embodiment, illustrating a plurality of detection electrodes, a plurality of pads, a plurality of line groups, and the like.

FIG. 18 is a cross-sectional view showing a part of the display device according to the other modified example, illustrating the second area and the like.

DETAILED DESCRIPTION

Figure 3:
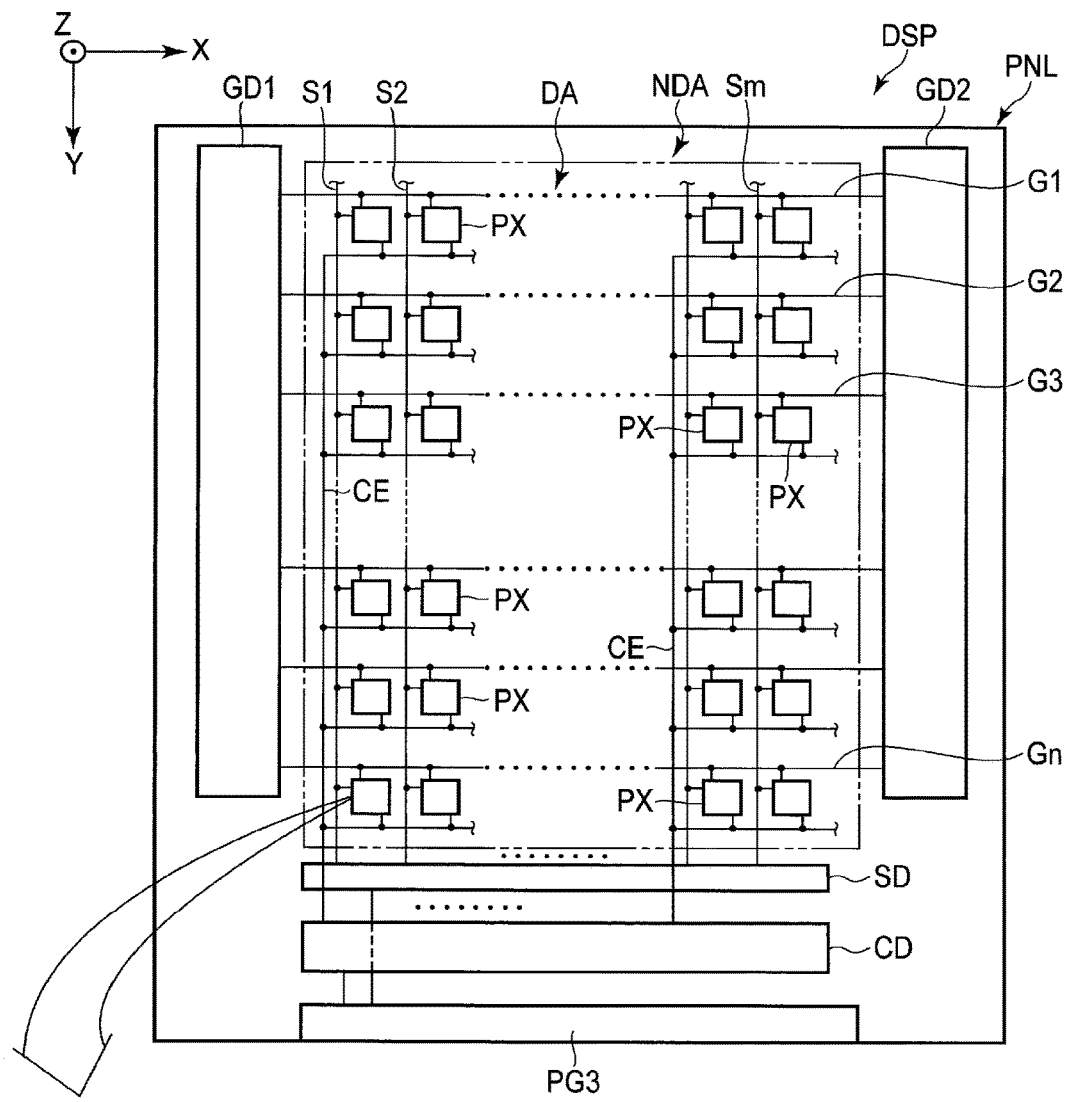
FIG. 3 is a view showing a basic configuration and an equivalent circuit of the display panel.
Figure 3:
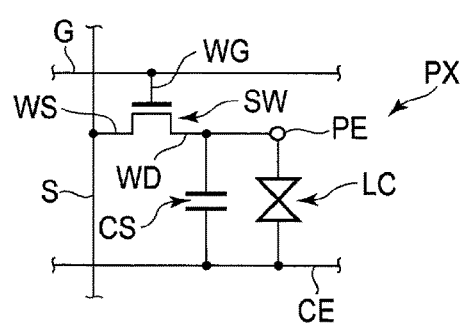

In general, according to one embodiment, there is provided a display device, comprising: a first substrate comprising a first insulating substrate located in a first area and a second area arranged with the first area, and a first conductive layer provided in the second area; a second substrate comprising a second insulating substrate opposed to the first substrate and located in the first area, and a second conductive layer provided above a surface on a side opposite to the side of the second insulating substrate which is opposed to the first substrate; and a first connection line opposed to a first side surface of the second insulating substrate to electrically connect the first conductive layer and the second conductive layer. The first area is an area where the first substrate and the second substrate overlap. The second area is an area where the first substrate and the second substrate do not overlap. The first connection line is formed of a photosensitive resin containing a conductive material.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same elements as those described in connection with preceding drawings are denoted by like reference numerals, and a detailed description thereof is omitted unless otherwise necessary.

In each of the embodiments, a display device comprising a display panel using liquid crystal display elements is disclosed as an example of the display device. However, each of the embodiments does not prevent application of individual technical ideas described in each of the embodiments to display devices employing display elements other than liquid crystal display elements. Examples of display devices other than the liquid crystal display device are self-luminous display devices comprising organic electroluminescent display devices, electronic paper-type display panels comprising electrophoretic elements, and the like.

First Embodiment

First, a display device of a First Embodiment will be explained in detail. The display device according to the present embodiment is a sensor-equipped display device. FIG. 1 is a plan view showing a configuration example of a display device according to a First Embodiment. In the present embodiment, the first direction X and the second direction Y are orthogonal to each other. The direction mentioned here is a direction indicated by an arrow in the figure, and a direction turning from an arrow at 180 degrees is regarded as an opposite direction. The first direction X and the second direction Y may intersect each other at an angle other than 90 degrees. A third direction Z is perpendicular to each of the first direction X and the second direction Y. The third direction Z corresponds to a direction of thickness of the display device DSP.

In the following explanations, a direction from the first substrate SUB1 to the second substrate SUB2 is called an upward direction (or, more simply, upwardly) and a direction from the second substrate SUB2 to the first substrate SUB1 is called a downward direction (or, more simply, downwardly). According to "a second member above a first member" and "a second member below a first member", the second member may be in contact with the first member or may be off the first member. In the latter case, a third member may be interposed between the first member and the second member. In addition, a view from the second substrate SUB2 to the first substrate SUB1 is called a planar view.

As shown in FIG. 1, the display device DSP comprises an active-matrix display panel PNL, circuit boards (wiring substrates) 1 and 2, IC chips I1 and I2, and the like. The display panel PNL is a liquid crystal display panel and comprises a first substrate SUB1, a second substrate SUB2 arranged to be opposed to the first substrate SUB1, a sealing member SE, and a liquid crystal layer LC which will be explained later. In the present embodiment, the first substrate SUB1 is formed in a rectangular shape, and the second substrate SUB2 is formed in a rectangular shape having an outline smaller than the first substrate SUB1.

In planar view, the first substrate SUB1 is located in a first area A1 and a second area A2 arranged beside the first area A1. The second substrate SUB2 is located in the first area A1 and is not located in the second area A2. In the example illustrated, three sides of the first substrate SUB1 and the second substrate SUB2, other than the side on which the circuit board 1 is mounted, overlap. In addition, the first area A1 can be expressed as a two-substrate portion of the display panel PNL at which two substrates, i.e., the first substrate SUB1 and the second substrate SUB2 overlap and, similarly, the second area A2 is a part of the first substrate SUB1 which is exposed from the second substrate SUB2 and can be expressed as a single substrate portion of the display panel PNL.

The display panel PNL comprises a display area DA on which an image is displayed and a non-display area NDA other than the display area DA. In the present embodiment, the display area DA is included in the first area A1, and the non-display area NDA is formed in a rectangular frame shape.

The sealing member SE is located in the non-display area NDA to bond the first substrate SUB1 and the second substrate SUB2.

In the non-display area NDA, a strip-shaped area which is located on the left side of the display area DA and which extends in the second direction Y is called a first non-display area NDA1, a strip-shaped area which is located on the right side of the display area DA and which extends in the second direction Y is called a second non-display area NDA2, a strip-shaped area which is located on the lower side of the display area DA and which extends in the first direction X is called a third non-display area NDA3, and a strip-shaped area which is located on the upper side of the display area DA and which extends in the first direction X is called a fourth non-display area NDA4. The second area A2 where the first substrate SUB1 is not opposed to the second substrate SUB2 is included in the third non-display area NDA3.

The display panel PNL comprises scanning line drive circuits GD1 and GD2, a circuit group CIR, and pad groups PG1, PG2, and PG3. The scanning line drive circuits GD1 and GD2 are configured to drive scanning lines which will be explained later, the scanning line drive circuit GD1 is disposed in the first non-display area NDA1, and the scanning line drive circuit GD2 is disposed in the second non-display area NDA2.

The circuit group CIR is disposed in the third non-display area NDA3. The circuit group CIR includes a plurality of circuits such as a common electrode drive circuit which drives a common electrode explained later, and the like. In the present embodiment, the common electrode is often called a sensor drive electrode.

Pad groups PG1, PG2, and PG3 are outer lead bonding pad groups and are disposed in the second area A2. In the present embodiment, pads included in the pad group PG3 is electrically connected to the scanning line drive circuits GD1 and GD2 and the circuit group CIR.

The circuit board 1 is physically connected to a part of the first substrate SUB1 which is located in the second area A2 and is electrically connected to a plurality of pads of the pad groups PG1, PG2, and PG3. The IC chip I1 is mounted on the circuit board 1. Unlike the present embodiment, however, the IC chip I1 may be mounted on a part of the first substrate SUB1 which is located in the second area A2. The IC chip I1 can supply signals to the scanning line drive circuits GD1 and GD2 and the circuit group CIR via the circuit board 1, the pad group PG3, and the like. The IC chip I1 incorporates, for example, a display driver DD which outputs a signal necessary for the image display. The display driver DD comprises at least parts of a signal line drive circuit SD which will be explained later, a scanning line drive circuit GD, and a common electrode drive circuit CD which will be explained later.

The circuit board 2 is connected to the circuit board 1. The circuit board 2 may be connected to a control module (not shown). The IC chip I2 is mounted on the circuit board 2. The IC chip I2 can receive a signal from a detection electrode which will be explained later, via the circuit board 2, the circuit board 1, the pad groups PG1 and PG2, and the like. In addition, in the example illustrated, the IC chip I2 incorporates a detection circuit RC which functions as a touch panel controller or the like. The IC chip I2 is connected to the pads of the pad groups PG1 and PG2 via the circuit board 2 and the circuit board 1. The detection circuit RC may be built in the IC chip I1.

Alternatively, the IC chips I1 and I2 may be mounted on an external circuit board, unlike the present embodiment.

The circuit boards 1 and 2 are, for example, flexible boards. The flexible board applicable to the present embodiment may comprise a flexible part formed of a bendable material, on at least a part of the flexible board. For example, the circuit boards 1 and 2 of the present embodiment may be flexible boards entirely formed as flexible parts, or rigid-flexible boards comprising rigid parts formed of a rigid material such as glass epoxy and flexible parts formed of a bendable material such as polyimide.

The display panel PNL is, for example, a transmissive liquid crystal display panel comprising a transmissive display function which displays an image by allowing the light from the lower side of the first substrate SUB1 to be selectively transmitted. Alternatively, the display panel PNL may be a reflective liquid crystal display panel comprising a reflective display function which displays an image by allowing the light from the upper side of the second substrate SUB2 to be selectively reflected. Alternatively, the display panel PNL may be a transreflective liquid crystal display panel comprising the transmissive display function and the reflective display function. If the display panel PNL is a transmissive liquid crystal display panel or a transreflective liquid crystal display panel, the display device DSP comprises an illumination device disposed on the back side of the first substrate SUB1.

Next, an example of the configuration concerning connection between a conductive layer (first conductive layer) CL1 on the first substrate SUB1 side and a conductive layer (second conductive layer) CL2 on the second substrate SUB2 side will be explained. FIG. 2 is a plan view showing a configuration example of the display panel PNL of the display device DSP, illustrating a plurality of detection electrodes Rx, a plurality of pads, a plurality of line groups WIG connecting the detection electrodes Rx and the pads, and the like.

As shown in FIG. 2, the first substrate SUB1 comprises a first insulating substrate 10, and a conductive layer CL1 provided in the second area A2. The second substrate SUB2 comprises a second insulating substrate 20 and a conductive layer CL2. In the present embodiment, the first insulating substrate 10 and the second insulating substrate 20 are glass substrates using alkali-free glass and the like, but may be resin substrates having flexibility. The first insulating substrate 10 includes a main surface 10A opposed to the second substrate SUB2. In the example illustrated, the conductive layer CL1 is located above the main surface 10A. The second insulating substrate 20 includes a main surface 20A on a side opposite to the side opposed to the first substrate SUB1. The conductive layer CL2 is provided above the main surface 20A.

The display device DSP comprises a first connection line CW1. The first connection line CW1 is electrically connected to the conductive layer CL1 and the conductive layer CL2. The first connection line CW1 is formed of resin containing a conductive material.

In the present embodiment, the conductive layer CL1 is a metal layer M2. However, the conductive layer CL may be a transparent conductive layer, unlike the present embodiment. Alternatively, the conductive layer CL may have a stacked layer structure including the metal layer M2 and the transparent conductive layer. The transparent conductive layer is formed of a transparent conductive material such as indium tin oxide (ITO), indium zinc oxide (IZO) or zinc oxide (ZnO).

The first substrate SUB1 further includes first lines W1. Each of pads of the pad groups PG1 and PG2 is hereinafter called a first pad P1. Each of the first lines W1 is provided in the second area A2 to electrically connect a single metal layer M2 (conductive layer CL1) to the single first pad P1.

A sensor SS executes sensing to detect contact or approach of the detected object to the display device DSP. The sensor SS comprises a plurality of conductive layers CL2. Each of the conductive layer CL2 and the metal layer M2 is formed of, for example, a metal material such as molybdenum, tungsten, titanium, aluminum, silver, copper or chromium or an alloy formed by a combination of these metal materials, and may be formed to have a single-layer structure or a multi-layer structure.

Each conductive layer CL2 includes the detection electrode Rx, second pad P2, and peripheral line L which connects the detection electrode Rx and the second pad P2.

The detection electrode Rx is located in at least the display area DA and formed in a strip shape, and elongated to the first direction X. In the example illustrated, the detection electrode Rx is formed in a strip shape but, more specifically, formed of an assembly of fine metal wires. The second pad P2 is located in the third non-display area NDA3 of the non-display area NDA and is connected to the detection electrode Rx. The second pad P2 is provided near an edge 20E1 on the second area A2 side of the second insulating substrate 20. The second pads P2 are arranged in the first direction X. The first connection line CW1 is in contact with the second pad P2.

Each of the peripheral line L connected to the corresponding detection electrode Rx extend in the first non-display area NDA1 or the second non-display area NDA2 and are connected to the corresponding second pad P2. The peripheral line L which is not connected to the detection electrode Rx is located on an outer side than the detection electrodes Rx and the peripheral lines L connected to the detection electrodes Rx, extend in the first non-display area NDA1, the second non-display area NDA2, and the fourth non-display area NDA4, formed in a shape of H, and is connected to the second pad P2 at a left end and the second pad P2 at a right end. The peripheral line L which is not connected to the detection electrode Rx is set at a common potential. The common electrode which will be explained later is also set at the common potential at the display drive.

Thus, a line group WIG connecting the detection electrode Rx and the first pad P1 is composed of the peripheral line L, the second pad P2, the first connection line CW1, the metal layer M2, and the first line W1. For this reason, the detection electrode Rx provided on the second substrate SUB2 is electrically connected to the above-explained detection circuit RC via the line group WIG, the first pad P1, and circuit boards 1 and 2. The detection circuit RC reads sensor signal output from the detection electrode Rx and detects contact or approach of the detected object, position coordinates of the detected object, and the like.

For this reason, the control circuit for writing the signals to the detection electrodes Rx and reading the signals output from the detection electrodes Rx can be connected to the detection electrodes Rx via the circuit board 2. In other words, the circuit board different from the circuit boards 1 and 2 does not need to be mounted on the second substrate SUB2. Increase in the manufacturing costs can be suppressed as the different circuit board does not need to be used. Alternatively, since the different circuit board does not need to be curved when assembling the display device DSP to a module, reduction in the degree of freedom for designing the module structure can be suppressed and, for example, a situation which prevents narrowing of the frame can be avoided.

In addition, when the detection electrodes Rx are counted from the fourth non-display area NDA4 to the third non-display area NDA3 side, the peripheral lines L connected to the odd-numbered detection electrodes Rx are located in the first non-display area NDA1, and the peripheral lines L connected to the even-numbered detection electrodes Rx are located in the second non-display area NDA2, in the example illustrated. In this layout, the width of the first non-display area NDA1 can be made equal to the width of the second non-display area NDA2 and the frame can be preferably narrowed.

FIG. 3 is a view showing a basic configuration and an equivalent circuit of the display panel PNL.

As shown in FIG. 3, the display panel PNL comprises a plurality of pixels PX in the display area DA. The pixel indicates a minimum unit capable of being independently controlled in accordance with the pixel signal and, for example, exists in an area including a switching element disposed at a position where a scanning line and a signal line to be explained later intersect. The pixels PX are arrayed in a matrix in the first direction X and the second direction Y. In addition, the display panel PNL comprises a plurality of scanning lines G (G1 to Gn), a plurality of signal lines S (S1 to Sm), a common electrode CE and the like, in the display area DA. The scanning lines G extend in the first direction X and are arranged in the second direction Y. The signal lines S extend in the second direction Y and are arranged in the first direction X. The scanning lines G and the signal lines S may not extend linearly, but may be partially bent. The common electrode CE is disposed across the pixels PX. The scanning lines G, the signal lines S, and the common electrode CE are drawn to the non-display area NDA. In the non-display area NDA, the scanning lines G are connected to the scanning line drive circuits GD1 and GD2, the signal lines S are connected to the signal line drive circuit SD, and the common electrode CE is connected to the common electrode drive circuit CD.

Each of the scanning lines G is connected to both of the scanning line drive circuits GD1 and GD2, and the connection is not limited to this but the scanning line G may be connected to any one of the scanning line drive circuits GD1 and GD2. For example, odd-numbered scanning lines G may be connected to the scanning line drive circuit GD1 and even-numbered scanning lines G may be connected to the scanning line drive circuit GD2. In addition, the signal line drive circuit SD, the scanning line drive circuit GD, and the common electrode drive circuit CD may be formed on the first substrate SUB1 or several or all parts of the circuits may be built in the IC chip I1 shown in FIG. 1.

Each of the pixels PX comprises a switching element SW, a pixel electrode PE, the common electrode CE, a liquid crystal layer LC, and the like. The switching element SW is composed of, for example, a thin-film transistor (TFT) and is electrically connected to the scanning line G and the signal line S. More specifically, the switching element SW comprises a gate electrode WG, a source electrode WS and a drain electrode WD. The gate electrode WG is electrically connected to the scanning line G. In the example illustrated, the electrode electrically connected to the signal line S is referred to as the source electrode WS, and the electrode electrically connected to the pixel electrode PE is referred to as the drain electrode WD.

The scanning line G is connected to the switching element SW in each of the pixels PX arranged in the first direction X. The signal line S is connected to the switching element SW in each of the pixels PX arranged in the second direction Y. Each of the pixel electrodes PE is opposed to the common electrode CE and drives the liquid crystal layer LC by an electric field generated between the pixel electrode PE and the common electrode CE. A storage capacitor CS is formed, for example, between the common electrode CE and the pixel electrode PE.

FIG. 4 is a cross-sectional view showing a partial structure of the display device DSP in the display area DA. The figure shows a cross-section of the display device DSP cut along X-Z plane.

As shown in FIG. 4, the illustrated display panel PNL is configured to mainly correspond to a display mode using a lateral electric field approximately parallel to a main surface of the substrate. The display panel PNL may be configured to correspond to a display mode using a longitudinal electric field perpendicular to the main surface of the substrate, an electric field inclined to the main surface of the substrate, or a combination of the electric fields. In the display mode using a lateral electric field, for example, a configuration in which both of the pixel electrode PE and the common electrode CE are disposed on any one of the first substrate SUB1 and the second substrate SUB2 can be employed. In the display mode using the longitudinal electric field or the oblique electric field, for example, a configuration in which any one of the pixel electrode PE and the common electrode CE is disposed on the first substrate SUB1 and the other is disposed on the second substrate SUB2 can be employed. The main surface of the substrate is a surface parallel to X-Y plane.

The first substrate SUB1 comprises the first insulating substrate 10, the signal lines S, the common electrode CE, metal layers M1, the pixel electrodes PE, a first insulating film 11, a second insulating film 12, a third insulating film 13, a first alignment film AL1, and the like. Illustration of the switching elements, scanning lines, and the like is omitted.

A first insulating film 11 is located on the first insulating substrate 10. The signal lines S are located on the first insulating film 11. The second insulating film 12 is located on the signal lines S and the first insulating film 11. The common electrode CE is located on the second insulating film 12. The metal layers M1 are in contact with the common electrode CE just above the signal lines S. In the example illustrated, the metal layers M1 are located on the common electrode CE but may be located between the common electrode CE and the second insulating film 12. The third insulating film 13 is located on the common electrode CE and the metal layers M1. The pixel electrodes PE are located on the third insulating film 13. The pixel electrodes PE are opposed to the common electrode CE via the third insulating film 13. In addition, the pixel electrodes PE include slits SL at positions opposed to the common electrode CE. The first alignment film AL1 covers the pixel electrodes PE and the third insulating film 13.

Each of the scanning lines, the signal lines S and the metal layers M1 are formed of a metal material such as molybdenum, tungsten, titanium, or aluminum, and may be formed to have a single-layer structure or a multi-layer structure. For example, the scanning lines are formed of a metal material containing molybdenum and tungsten, the signal lines S are formed of a metal material containing titanium and aluminum, the metal layers M1 are formed of a metal material containing molybdenum and aluminum, and the scanning lines, the signal lines S, and the metal layers M1 are thus formed of different materials. The common electrode CE and the pixel electrodes PE are formed of a transparent conductive material such as ITO or IZO. The first insulating film 11 and the third insulating film 13 are inorganic insulating films, and the second insulating film 12 is an organic insulating film.

The configuration of the first substrate SUB1 is not limited to the example illustrated, but the pixel electrodes PE may be located between the second insulating film 12 and the third insulating film 13 and the common electrode CE may be located between the third insulating film 13 and the first alignment film AL1. In this case, the pixel electrodes PE are formed in a flat plate shape including no slits, and the common electrode CE includes slits opposed to the pixel electrodes PE. In addition, both of the pixel electrodes PE and the common electrode CE may be formed in a comb tooth shape and disposed to be engaged with each other.

The second substrate SUB2 comprises a second insulating substrate 20, the light-shielding layers BM, a color filter CF, an overcoat layer OC, a second alignment film AL2, and the like.

The light-shielding layers BM and the color filter CF are located on a side of the second insulating substrate 20 which is opposed to the first substrate SUB1. The light-shielding layers BM section the pixels and are located just above the signal lines S. The color filter CF is opposed to the pixel electrode PE, and partially overlaps the light shielding layers BM.

The color filter CF includes a red filter, a green filter, a blue filter, and the like. The overcoat layer OC covers the color filter CF. The second alignment film AL2 covers the overcoat layer OC.

The color filter CF may be disposed on the first substrate SUB1. The color filter CF may include color filters of four or more colors. A white color filter or an uncolored resin material may be disposed on the pixel displaying white color or not the filter but the overcoat layer OC may be disposed.

The detection electrode Rx is located on a main surface 20A of the second insulating substrate 20. The detection electrode Rx is formed of a conductive layer containing a metal as explained above. An insulating layer IL is formed on the detection electrode Rx.

A first optical element OD1 including a first polarizer PL1 is located between the first insulating substrate 10 and the illumination unit BL. A second optical element OD2 including a second polarizer PL2 is located on the insulating layer IL. Each of the first optical element OD1 and the second optical element OD2 may include a retardation film as needed. In addition, a cover member may be provided on the insulating layer IL instead of the second optical element OD2 or may be further provided on the second optical element OD2, though not illustrated in the drawing. The cover member is formed of, for example, a glass substrate. In this case, the cover member may be called a cover glass. Alternatively, the cover member can be formed by using a substrate having a light transmitting property such as a resin substrate.

Next, a configuration example of the sensor SS built in the display device DSP of the embodiment will be explained. The sensor SS explained below is, for example, a mutual-capacitive type capacitive sensor, which detects contact or approach of the object, based on the variation in electrostatic capacitance between a pair of opposed electrodes via a dielectric.

FIG. 5 is a plan view showing a configuration example of the sensor SS.

As shown in FIG. 5, the sensor SS comprises the sensor drive electrodes Tx and the detection electrodes Rx in the illustrated configuration example. In the example illustrated, the sensor drive electrodes Tx correspond to portions represented by right-downward diagonal hatch lines and are provided on the first substrate SUB1. In addition, the detection electrodes Rx correspond to portions represented by right-upward diagonal hatch lines and are provided on the second substrate SUB2. The sensor drive electrodes Tx and the detection electrodes Rx intersect each other in X-Y plane. The detection electrodes Rx are partially opposed to the sensor drive electrodes Tx in the third direction Z.

The sensor drive electrodes Tx and the detection electrodes Rx are located in the display area DA and partially elongated to the non-display area NDA. In the example illustrated, the sensor drive electrodes Tx are shaped in a strip shape elongated in the second direction Y, and arranged in the first direction X and spaced apart from each other. The detection electrodes Rx are arranged in the second direction Y and are spaced apart from each other. Each of the sensor drive electrodes Tx is electrically connected to the common electrode drive circuit CD via a lead-out line WR. The number, size, and shape of the sensor drive electrodes Tx and the detection electrodes Rx are not particularly limited and can be variously changed.

In the present embodiment, the above-explained common electrode CE is used as the sensor drive electrode Tx. The sensor drive electrode Tx is the common electrode CE. The sensor drive electrode Tx (common electrode CE) comprises a function of generating an electric field between the pixel electrode PE and the common electrode CE, and a function of detecting a position of an object by generating capacitance between the sensor drive electrode Tx and the detection electrode Rx.

The common electrode drive circuit CD supplies common drive signals to the sensor drive electrodes Tx at the display drive for displaying an image on the display area DA. In addition, the common electrode drive circuit CD supplies sensor drive signals to the sensor drive electrodes Tx at the sensing drive for sensing. The common electrode drive circuit CD and the IC chip I1 functions as drivers of the sensor SS.

The detection electrode Rx outputs sensor signal necessary for sensing in accordance with supply of the sensor drive signal to the sensor drive electrode Tx. The sensor signal output from the detection electrode Rx is based on the inter-electrode capacitance between the sensor drive electrode Tx and the detection electrode Rx, and the capacitance between the sensor drive electrode Tx and the detected object. The detection signals output from the detection electrodes Rx are input to the IC chip I2 (detection circuit RC) shown in FIG. 1. The IC chip I2 functions as the controller of the sensor SS and detects the sensor output values of the detection electrodes Rx.

The sensor SS in each of the above-explained configuration examples is not limited to the mutual-capacitive sensor, but may be a self-capacitive sensor which detects the detected object, based on the variation in the electrostatic capacitance between the detection electrodes Rx and the detected object.

Next, a configuration of several parts of the display panel PNL such as a configuration of a first connection line will be explained. FIG. 6 is a perspective view showing a part of the display panel PNL, illustrating metal layers M2, an insulating member IM, second pads P2, first connection lines CW1, and the like.

As shown in FIG. 6, the second insulating substrate 20 includes a first side surface 20S1 on the second area A2 side, on the boundary between the first area A1 and the second area A2. The display panel PNL comprises an insulating member IM which is in contact with the first side surface 20S1 of the second insulating substrate 20 and the first substrate SUB1. In the present embodiment, the insulating member IM is provided separately on the left side and the right side of the display panel PNL. However, an area in which the insulating member IM is formed is not limited to that in the present embodiment, but can be variously modified. The insulating member IM may be provided in at least an area where the first connection lines CW1 are formed. For example, the insulating member IM may be provided sequentially from the left end to the right end of the display panel PNL and formed without being divided, unlike the present embodiment.

In addition, the first connection line CW1 is opposed to the first side surface 20S1 of the second insulating substrate 20. In the present embodiment, the first connection line CW1 is in contact with the insulating member IM. The insulating member IM includes a side surface IMS which is in contact with the first connection line CW1. The shape of the side surface IMS is not particularly limited. In the present embodiment, if the first substrate SUB1 is referred to as the lower side and the second substrate SUB2 is referred to as the upper side, the side surface IMS of the insulating member IM is a forward tapered surface.

When using the insulating member IM, a situation in which the line resistance of the first connection line CW1 becomes high and a situation in which the first connection line CW1 is disconnected can be avoided as compared with a case of not using the insulating member IM. In the present embodiment, the first connection line CW1 is in contact with the side surface IMS which is the forward tapered surface. In this case, the situation in which the line resistance of the first connection line CW1 becomes high, and the like can be further avoided.

To form the first connection line CW1, generally known methods such as transfer, photolithography can be employed.

When the transfer is employed, a support film on which the first connection lines CW1 are applied is prepared, and the support film is applied to the side surface IMS of the insulating member IM, and the like, to bring each of the first connection line CW1 into contact with the second pad P2, the side surface IMS, the metal layer M2, and the like. In this state, the first connection lines CW1 are heated. After that, the first connection lines CW1 are peeled off from the support film by peeling off the support film from the display panel PNL. The first connection lines CW1 are thereby transferred to the display panel PNL.

In contrast, when the photolithography is employed, first, photosensitive resin containing a conductive material is applied on the display panel PNL. In this case, the application is facilitated by using a dispenser, a spin coater, and the like. After that, the applied photosensitive resin is subjected to exposure and development and then the remaining photosensitive resin is burnt. The first connection lines CW1 are formed on the display panel PNL. In the burning, the temperature of the display panel PNL is in a range from approximately 100 to 140° C. and, preferably, comparatively low in a range from 100 to 120° C. For this reason, a bad influence of heat to the liquid crystal layer LC can also be suppressed by employing the photolithography. In addition, the photosensitive resin containing the conductive material is a photosensitive resin in which conductive particles are dispersed. The material of the conductive particles is, for example, gold, silver, silver palladium, copper or platinum. Since each of the first connection line CW1 is an assembly of the conductive particles, the first connection lines CW1 which can hardly be disconnected can be obtained.

Figure 7:
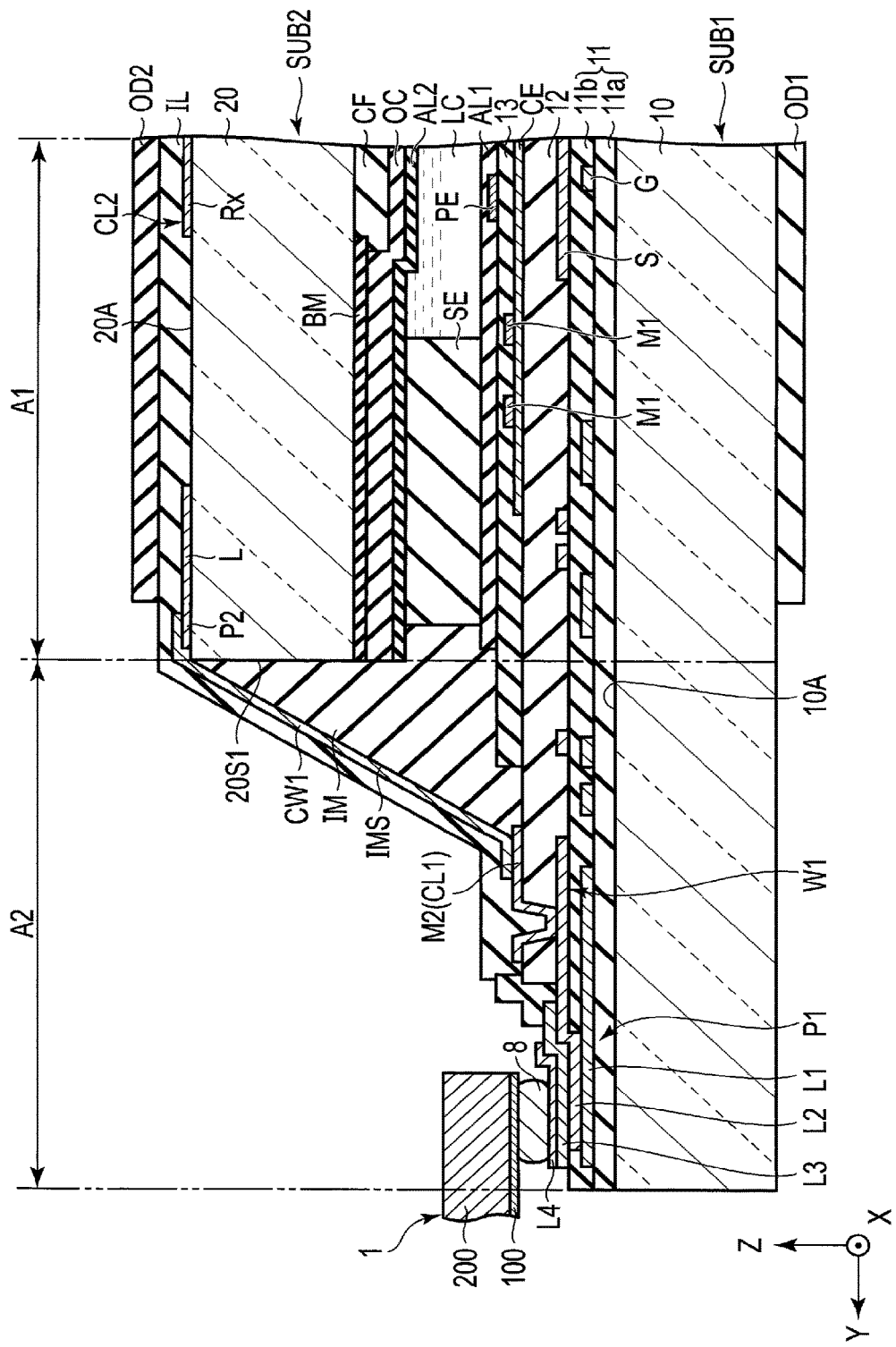

Next, a sectional structure of the display panel PNL will be explained. In particular, a sectional structure of the display panel PNL in the second area A2 will be explained. FIG. 7 is a cross-sectional view showing a part of the display device DSP, illustrating the second area A2, and the like.

As shown in FIG. 7, the first pad P1 includes a first layer L1, a second layer L2, a third layer L3, and a fourth layer L4 and has a stacked layer structure. In addition, the first insulating film 11 includes an insulating film 11a and an insulating film 11b. A semiconductor layer of the switching element SW is located between the first insulating substrate 10 and the insulating film 11a. The scanning line G and the first layer L1 are located between the insulating film 11a and the insulating film 11b. For this reason, the scanning line G and the first layer L1 can be formed of the same material, simultaneously.

The signal line S and the second layer L2 are located between the insulating film 11b and the second insulating film 12. For this reason, the signal line S and the second layer L2 can be formed of the same material, simultaneously. The second layer L2 is in contact with the first layer L1, through a contact hole formed in the insulating film 11b. The second layer L2 forms a part of the first pad P1 and further forms the first line W1.

The second insulating film 12 is provided in an area other than the area where the first pads P1 are formed. The common electrode CE is located on the second insulating film 12, and the third layer L3 is located on the second insulating film 12 and the second layer L2. The third layer L3 is in contact with the second layer L2. The common electrode CE and the third layer L3 can be formed of the same material, simultaneously.

The metal layer M1 is located on the common electrode CE. The metal layer M2 is located on the second insulating film 12, and is in contact with the second layer L2 through a contact hole formed in the second insulating film 12. The metal layer M1 and the metal layer M2 can be formed of the same material, simultaneously. As understood from FIG. 7, various insulating films and various conductive films are disposed between the first insulating substrate 10 and the metal layer M2 (conductive layer CL1).

The third insulating film 13 is provided in an area other than the area where the first pad P1 is formed and the area opposed to the metal layer M2. The pixel electrode PE is located on the third insulating film 13, and the fourth layer L4 is located on the third layer L3 and is in contact with the third layer L3. The pixel electrode PE and the fourth layer L4 can be formed of the same material, simultaneously.

The conductive layer CL2 including the detection electrode Rx, the peripheral line L, and the second pad P2 is located on the main surface 20A. Various insulating layers and various conductive films may be disposed between the second insulating substrate 20 and the conductive layer CL2. The first insulating substrate 10, the metal layer M2, the second insulating substrate 20, and the detection electrode Rx are arranged in this order in the third direction Z.

The insulating member IM is in contact with the first side surface 20S1 and end portion of the metal layer M2 on the first area A1 side, and the like. In addition, a bump surrounded by the first substrate SUB1, the second substrate SUB2, and the sealing member SE is filled with the insulating member IM. The first connection line CW1 is formed on the metal layer M2, the insulating member IM, and the second pad P2. The insulating layer IL is formed on the second insulating substrate 20, the detection electrode Rx, the peripheral line L, the second pad P2, the insulating member IM, the first connection line CW1, the metal layer M2, and the like to cover the detection electrode Rx, the peripheral line L, the second pad P2, the metal layer M2, the first connection line CW1, and the like.

The circuit board 1 is mounted on the first substrate SUB1 via an anisotropically conductive film 8 which is the conductive material in the second area A2. The circuit board 1 comprises a core substrate 200 and a connection line 100 disposed on a lower surface side of the core substrate 200.

According to the display device of the first embodiment configured as explained above, the metal layers M2 (conductive layers CL1) of the first substrate SUB1 and the conductive layers CL2 of the second substrate are electrically composed by the first connection lines CW1 composed of the resin containing the conductive material, in the display device DSP. The circuit board different from the circuit boards 1 and 2 does not need to be mounted on the second substrate SUB2. Thus, the display device DSP which enables the manufacturing costs to be reduced can be obtained. The display device DSP capable of making the frame narrower can be obtained.

Modified Example 1 of First Embodiment

Figure 8:
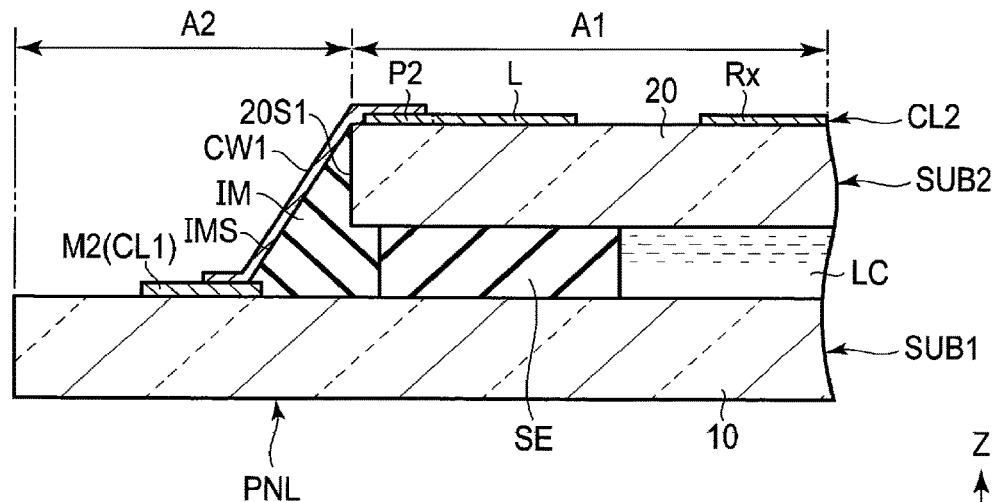

Next, the display device according to Modified Example 1 of the First Embodiment will be explained. FIG. 8 is a cross-sectional view showing a part of the display device DSP according to Modified Example 1 of the First Embodiment, illustrating the second area A2, and the like.

As shown in FIG. 8, Modified Example 1 is different from the above-explained First Embodiment with respect to a feature that the display device DSP comprises no insulating layer IL. In the display device DSP according to Modified Example 1, too, the same advantages as those of the display device according to the First Embodiment can be obtained.

Modified Example 2 of First Embodiment

Figure 9:
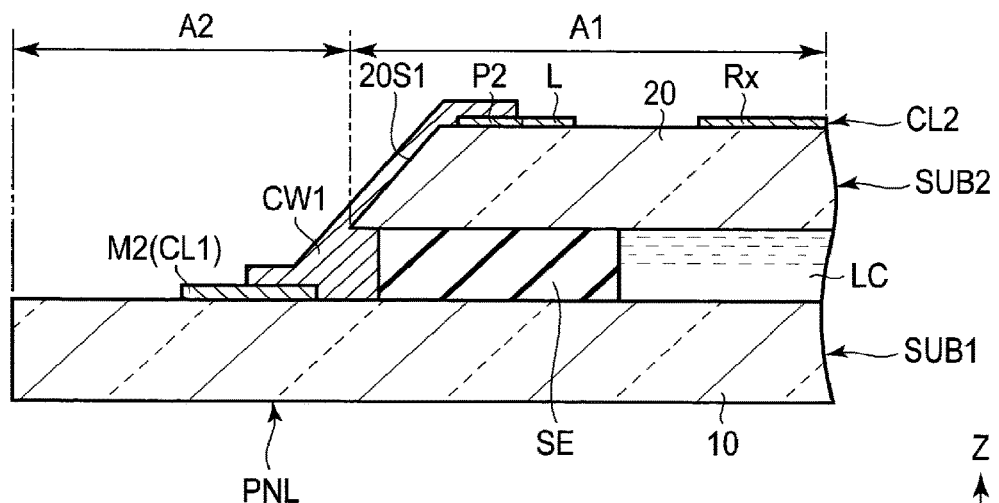

Next, the display device according to Modified Example 2 of the First Embodiment will be explained. FIG. 9 is a cross-sectional view showing a part of the display device DSP according to Modified Example 2 of the First Embodiment, illustrating the second area A2, and the like.

As shown in FIG. 9, Modified Example 2 is different from the above-explained First Embodiment with respect to a feature that the display device DSP comprises no insulating layer IL. In addition, the shape of the first side surface 20S1 of the second insulating substrate 20 is also different from that in the First Embodiment. In Modified Example 2, if the first substrate SUB1 is referred to as the lower side and the second substrate SUB2 is referred to as the upper side, the first side surface 20S1 is a forward tapered surface.

The first connection line CW1 is located on the metal layer M2, the first side surface 20S1, the second pad P2, and the like and is in contact with the first side surface 20S1. In addition, a bump surrounded by the first substrate SUB1, the second substrate SUB2, and the sealing member SE is filled with the first connection line CW1. If the first side surface 20S1 is the forward tapered surface, photolithography should preferably be used for the formation of the first connection line CW1. According to the above-explained display device DSP of Modified Example 2, the second insulating substrate 20 includes the first side surface 20S1 which is the forward tapered surface. For this reason, in the Modified Example 2, too, the same advantages as those of the First Embodiment can be obtained.

Modified Example 3 of First Embodiment

Next, the display device according to Modified Example 3 of the First Embodiment will be explained. FIG. 10 is a cross-sectional view showing a part of the display device DSP according to Modified Example 3 of the First Embodiment, illustrating the second area A2, and the like.

As shown in FIG. 10, Modified Example 3 is different from the above-explained Modified Example 2 with respect to a feature that the display device DSP comprises the insulating layer IL. In Modified Example 3, the first side surface 20S1 is not a forward tapered surface. In this case, photolithography should preferably be used for the formation of the first connection line CW1. In the Modified Example 3, too, the same advantages as those of the First Embodiment can be obtained.

Modified Example 4 of First Embodiment

Next, the display device according to Modified Example 4 of the First Embodiment will be explained. FIG. 11 is a cross-sectional view showing a part of the display device DSP according to Modified Example 4 of the First Embodiment, illustrating the second area A2, and the like.

As shown in FIG. 11, Modified Example 4 is different from the above-explained First Embodiment with respect to features that the display device DSP further comprises an insulating layer II and that the first connection line CW1 is formed on the insulating layer IL.

The insulating layer IL functions as an insulating member and is in contact with the first side surface 20S1, the first substrate SUB1, the sealing member SE, and the like. The insulating layer IL covers the detection electrode Rx, the peripheral line L, the second pad P2, the metal layer M2, and the like. A side surface ILS of the insulating layer IL which is opposed to the first side surface 20S1 is a forward tapered surface. The first connection line CW1 is located on the insulating layer IL and is in contact with the insulating layer IL such as the side surface ILS. In the first area A1, the first connection line CW1 is in contact with the second pad P2 through a contact hole formed in the insulating layer IL. In contrast, in the second area A2, the first connection line CW1 is in contact with the metal layer M2 through a contact hole formed in the insulating layer IL.

The insulating layer II is located on the insulating layer IL and the first connection line CW1 and covers the first connection line CW1. If the first connection line CW1 needs to be intervened inside the contact hole of the insulating layer IL, photolithography should preferably be used for the formation of the first connection line CW1. In the above-explained Modified Example 4, too, the same advantages as those of the First Embodiment can be obtained.

Second Embodiment

Figure 12:
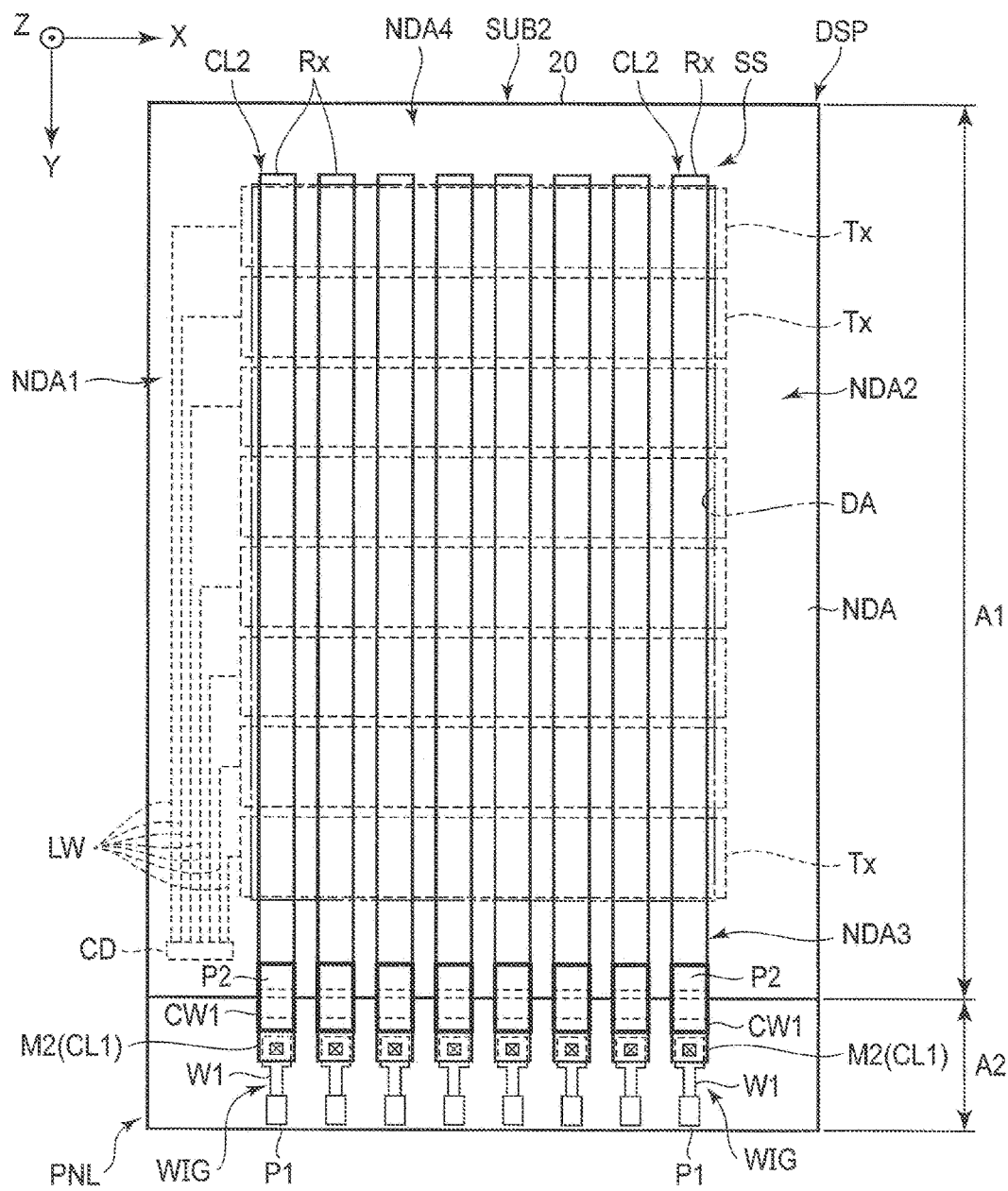

Next, a display device DSP of a Second Embodiment will be explained in detail. FIG. 12 is a plan view showing a configuration example of a display panel PNL of the display device DSP according to the Second Embodiment, illustrating a plurality of detection electrodes Rx, a plurality of pads P, a plurality of line groups WIG, and the like. The display device DSP of the present embodiment is different from the display device DSP of the First Embodiment with respect to features that sensor drive electrodes Tx extend in the first direction X while the detection electrodes Rx extend in the second direction Y.

As shown in FIG. 12, the sensor drive electrodes Tx are arranged in the second direction Y to be spaced apart from each other and extend approximately linearly in the first direction X, in the display area DA. The sensor drive electrodes Tx are electrically connected to a common electrode drive circuit CD via peripheral lines LW provided on a first substrate SUB1. In the present embodiment, the peripheral lines LW extend in a first non-display area NDA1.

The detection electrodes Rx are arranged in the first direction X to be spaced apart from each other and extend approximately linearly in the second direction Y, in the display area DA. The sensor drive electrodes Tx and the detection electrodes Rx are opposed with various dielectrics sandwiched between the electrodes. A conductive layer CL2 includes the detection electrode Rx and second pad P2. Unlike the First Embodiment, the conductive layer CL2 does not include the above-explained peripheral lines L.

First pads P1 are not densely packed in a specific area unlike the First Embodiment. In the present embodiment, pads of a pad group P3 are located between pairs of adjacent first pads P1, though not illustrated in the drawing.

Figure 13:
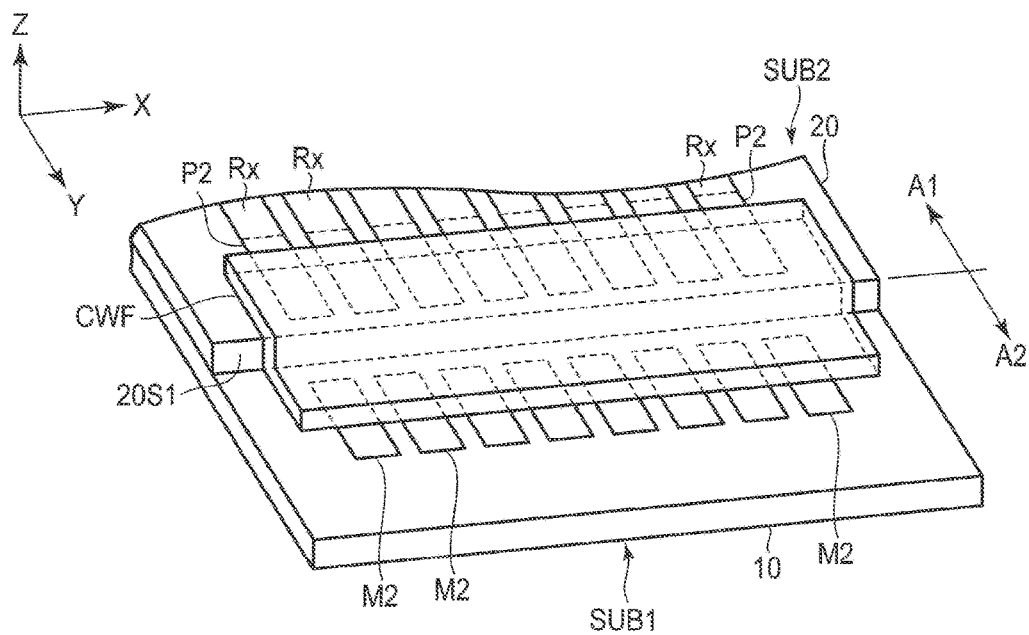
FIG. 13 is a perspective view for explanation of a method of manufacturing the display device according to the Second Embodiment, illustrating a state in which photosensitive resin is applied onto a plurality of second pads and a plurality of metal layers.

Next, a method of manufacturing a display device according to a second embodiment will be explained. A method of manufacturing first connection lines CW1 will be explained here. FIG. 13 is a perspective view for explanation of a method of manufacturing the display device DSP according to the Second Embodiment, illustrating a state in which photosensitive resin is applied onto a plurality of second pads P2 and a plurality of metal layers M2.

As shown in FIG. 13, in the present embodiment, photolithography is employed for formation of the first connection lines CW1. When the photolithography is employed, first, photosensitive resin CWF containing a conductive material is applied on the display panel PNL. The photosensitive resin CWF is in contact with all of the metal layers M2 and all of the second pads P2. After that, the photosensitive resin CWF is subjected to exposure, development, and burning. The first connection lines CW1 shown in FIG. 12 are thereby formed.

According to the display device of the Second Embodiment configured as explained above, the metal layer M2 (conductive layer CL1) of the first substrate SUB1 and the conductive layer CL2 of the second substrate are electrically connected by the first connection line CW1 formed of resin containing the conductive material, in the display device DSP. Thus, the display device DSP which enables the manufacturing costs to be reduced can be obtained. The display device DSP capable of making the frame narrower can be obtained.

The display device DSP of the Second Embodiment can be variously modified by applying the techniques of the First Embodiment and the modified examples of the First Embodiment. Similarly, modified examples of the Second Embodiment as explained below can be variously modified by applying the techniques of the First Embodiment and the modified examples of the First Embodiment.

Modified Example 1 of Second Embodiment

Figure 14:
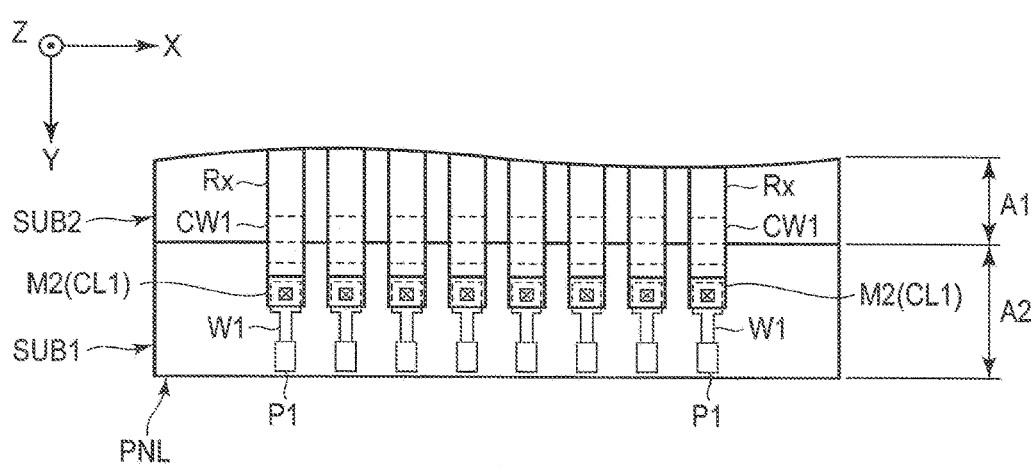

Next, the display device according to Modified Example 1 of the Second embodiment will be explained. FIG. 14 is a plan view showing a part of the display device DSP according to Modified Example 1 of the Second Embodiment, illustrating the second area A2, and the like.

As shown in FIG. 14, Modified Example 1 is different from the above-explained Second Embodiment with respect to a feature that the detection electrode Rx and the first connection line CW1 are integrally formed of the same material.

Unlike the Second Embodiment, the conductive layer CL2 does not include the above-explained second pad P2. The detection electrode Rx and the first connection line CW1 are formed of the same material, simultaneously. A material used to form the detection electrodes Rx and the first connection lines CW1 is resin containing a conductive material. In Modified Example 1, the paste containing conductive silver particles is used to form the detection electrodes Rx and the first connection lines CW1. In the above-explained display device DSP according to Modified Example 1, too, the same advantages as those of the display device according to the Second Embodiment can be obtained.

Modified Example 2 of Second Embodiment

Next, the display device according to Modified Example 2 of the Second Embodiment will be explained. FIG. 15 is a plan view showing a part of the display device DSP according to Modified Example 2 of the Second Embodiment, illustrating the first connection lines CW1, and the like.

As shown in FIG. 15, the first connection line CW1 has a width WI1, the metal layer M2 (conductive layer CL1) has a width WI2, and the second pad P2 has a width WI3, in the direction of extension of the first side surface 20S1 of the second insulating substrate 20. In Modified Example 2, the direction of extension of the first side surface 20S1 is the first direction X. The width WI1 is larger than the width WI2. In addition, the width WI1 is larger than the width WI3.

In the above-explained Modified Example 2, too, the same advantages as those of the Second Embodiment can be obtained. The first connection line CW1 is formed to be wider than the metal layer M2. For this reason, the connection resistance in the line group WIG can be reduced.

Modified Example 3 of Second Embodiment

Next, the display device according to Modified Example 3 of the Second Embodiment will be explained. FIG. 16 is a plan view showing a part of the display device DSP according to Modified Example 3 of the Second Embodiment, illustrating the first connection line CW1, the second connection line CW2, and the like.

As shown in FIG. 16, not the single connection line CW, but a plurality of connection lines CW may be used for the connection between the detection electrode Rx and the metal layer M2 (conductive layer CL1). The display device DSP further comprises the second connection line CW2.

The second connection line CW2 is provided independently of the first connection line CW1 to electrically connect the second pad P2 (conductive layer CL2) and the metal layer M2 (conductive layer CL1). In a cross-section in which the first substrate SUB1 is on the lower side and the second substrate SUB2 is on the upper side, the second connection line CW2 is opposed to the first side surface 20S1, similarly to the first connection line CW1, though not illustrated in the drawing. The second connection line CW2 has, for example, a width WI4 in the first direction X. In the present modified example, the width WI1 is smaller than each of the width WI2 and the width WI3, and the width WI4 is smaller than each of the width W12 and the width WI3.

In the above-explained Modified Example 3, too, the same advantages as those of the Second Embodiment can be obtained. By connecting the second pad P2 and the metal layer M2 by the connection lines CW, a situation in which the connection resistance at the line group WIG becomes higher can be avoided. Alternatively, even if one connection line CW of the connection lines CW is disconnected, the second pad P2 and the metal layer M2 can be connected by the other connection line CW.

Modified Example 4 of Second Embodiment

Next, the display device according to Modified Example 4 of the Second Embodiment will be explained. FIG. 17 is a plan view showing a configuration example of the display panel PNL of the display device DSP according to Modified Example 4 of the Second Embodiment, illustrating a plurality of detection electrodes Rx, a plurality of pads P, a plurality of line groups WIG, and the like.

As shown in FIG. 17, in planar view, the first substrate SUB1 is located in the first area A1 and the second area A2 and further located in the third area A3. The first area A1 is located between the second area A2 and the third area A3. The second substrate SUB2 is located in the first area A1 and is not located in the second area A2 or the third area A3. The metal layers M2 (conductive layers CL1) are located in the third area A3.

The second insulating substrate 20 includes a second side surface 20S2 on the third area A3 side. The first connection line CW1 is opposed to the second side surface 20S2 of the second insulating substrate 20 and is electrically connected to the second pad P2 and the metal layer M2.

Each of the first lines W1 electrically connected to the detection electrodes Rx on the left half side, of the detection electrodes Rx, extends in the fourth non-display area NDA4 (third area A3), the first non-display area NDA1, and the third non-display area NDA3 and is electrically connected to one first pad P1 of the pad group PG1. Each of the first lines W1 electrically connected to the detection electrodes Rx on the right half side, of the detection electrodes Rx, extends in the fourth non-display area NDA4 (third area A3), the second non-display area NDA2, and the third non-display area NDA3 and is electrically connected to one first pad P1 of the pad group PG2.

In the above-explained Modified Example 4, too, the same advantages as those of the Second Embodiment can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

Figure 18:
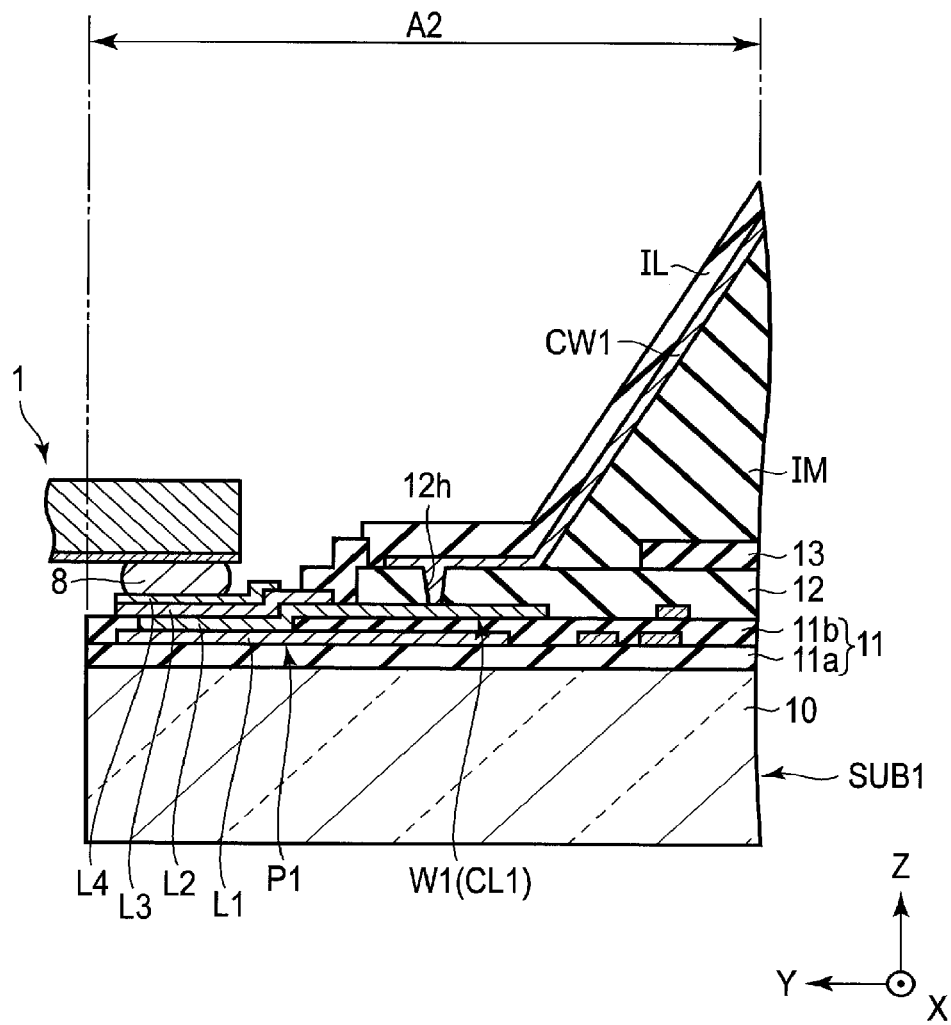

The conductive layer CL1 is not limited to the metal layer M2 but can be variously modified. For example, as shown in FIG. 18, the conductive layer CL1 may be the first line W1. In this case, the first connection line CW1 (connection line CW) is in contact with the first line W1 (second layer L2) through a contact hole 12h formed in the second insulating film 12.

The conductive layer CL2 may be a conductive layer other than that for sensor SS, such as the detection electrode Rx.

What is claimed is:

1. A display device, comprising:
a first substrate comprising a first insulating substrate located in a first area and a second area arranged with the first area, and a first conductive layer provided in the second area;
a second substrate comprising a second insulating substrate opposed to the first substrate and located in the first area, and a second conductive layer provided above a surface on a side opposite to the side of the second insulating substrate which is opposed to the first substrate; and
a first connection line opposed to a first side surface of the second insulating substrate to electrically connect the first conductive layer and the second conductive layer,
wherein
the first area is an area where the first substrate and the second substrate overlap,
the second area is an area where the first substrate and the second substrate do not overlap, and
the first connection line is formed of a photosensitive resin containing a conductive material.

2. The display device of claim 1, further comprising:
an insulating member which is in contact with the first side surface of the second insulating substrate and the first substrate,
wherein
the first connection line is in contact with the insulating member.

3. The display device of claim 2, wherein
the insulating member includes a side surface in contact with the first connection line, and
if the first substrate is referred to as a lower side and the second substrate is referred to as an upper side, the side surface of the insulating member is a forward tapered surface.

4. The display device of claim 1, further comprising:
an insulating member which is in contact with the first side surface of the second insulating substrate and the first substrate and which covers the second conductive layer,
wherein
the first connection line is in contact with the insulating member, and is in contact with the second conductive layer through a contact hole formed in the insulating member.

5. The display device of claim 1, wherein
the second conductive layer and the first connection line are integrally formed of the same material.

6. The display device of claim 1, wherein
the first substrate further comprises a first pad provided in the second area, and a first line which electrically connects the first conductive layer and the first pad.

7. The display device of claim 1, wherein
a width of the first connection line is larger than a width of the first conductive layer, in a direction of extension of the first side surface of the second insulating substrate.

8. The display device of claim 1, further comprising:
a second connection line opposed to the first side surface of the second insulating substrate and provided independently of the first connection line to electrically connect the first conductive layer and the second conductive layer.

9. The display device of claim 1, further comprising:
a detection circuit electrically connected to the first conductive layer to read a sensor signal output from the second conductive layer.

10. The display device of claim 9, wherein
the second conductive layer comprises a detection electrode located in a display area of the first area, and a second pad located in a non-display area other than the display area and connected to the detection electrode, the first connection line is in contact with the second pad, and the first substrate further comprises a sensor drive electrode intersecting the detection electrode.

11. A display device comprising:

a first substrate comprising a plurality of switching elements, a sensor drive electrode, and a first pad;

a second substrate comprising a second insulating substrate having a first main surface opposed to the first substrate and a second main surface on a side opposite to the first main surface, a detection electrode formed on the second main surface, a second pad connected to the detection electrode; and a connection line containing a conductive material and electrically connecting the first pad and the second pad, wherein the connection line is formed of a photosensitive resin containing a conductive material, the first pad is provided in an area where the first substrate is exposed from the second substrate, and the second pad, the connection line, and the detection electrode is covered with an insulating layer.

12. The display device of claim 11, further comprising:

a sealing member bonding the first substrate and the second substrate; and an insulating member, wherein the insulating member is in contact with a side surface of the second insulating substrate located on a boundary between a first area where the first substrate and the second substrate overlap and a second area where the first substrate and the second substrate do not overlap, the sealing member, and the first substrate in the second area.

13. The display device of claim 12, wherein the sealing member does not overlap the boundary between the first area and the second area, and a bump surrounded by the first substrate, the second substrate, and the sealing member is filled with the insulating member.

14. The display device of claim 13, wherein the first substrate further comprises in the first area, a first insulating film covering the switching element, a second insulating film on the first insulating film, an alignment film on the second insulating film, and a pixel electrode electrically connected to the switching element, the sensor drive electrode is held between the first insulating film and the second insulating film, the pixel electrode is held between the second insulating film and the alignment film, and the first insulating film and the second insulating film extend in the second area.

15. The display device of claim 14, wherein the insulating member is in contact with the second insulating film in the second area.

16. The display device of claim 15, wherein the insulating member is in contact with the first insulating film in the second area.

17. The display device of claim 16, wherein the first substrate further includes a metal layer which relays connection between the first pad and the connection line in the second area, and the metal layer is formed on the first insulating layer.

18. The display device of claim 17, wherein the first substrate further includes a line connecting the first pad and the metal layer, and the metal layer and the line are connected via a contact hole of the first insulating film in the second area.

* * * * *

UNITED STATES PATENT AND TRADEMARK OFFICE
CERTIFICATE OF CORRECTION

PATENT NO. : 10,503,002 B2
APPLICATION NO. : 15/922285
DATED : December 10, 2019
INVENTOR(S) : Arihiro Takeda et al.

It is certified that error appears in the above-identified patent and that said Letters Patent is hereby corrected as shown below:

On the Title Page

Item (72), the sixth inventor's name is omitted. Item (72) should read:
-- (72) Inventors: Arihiro Takeda, Tokyo (JP); Shoji Hinata, Tokyo (JP); Yoshikatsu Imazeki, Tokyo (JP); Nobuko Fukuoka, Tokyo (JP); Jin Hirosawa, Tokyo (JP); Yuji Sato, Tokyo (JP) --

Signed and Sealed this
Seventeenth Day of March, 2020

Andrei Iancu
*Director of the United States Patent and Trademark Office*